SILICON OXIDE TUNNEL DIODE STRUCTURE AND METHOD OF MAKING SAME

INVENTORS D. L. KLEIN
K. L. LAWLEY
BY
Edward M. Fink
ATTORNEY

United States Patent Office 3,424,954

Patented Jan. 28, 1969

3,424,954

SILICON OXIDE TUNNEL DIODE STRUCTURE AND METHOD OF MAKING SAME

Donald L. Klein, New Providence, and Kenneth L. Lawley, Livingston, N.J., assignors to Bell Telephone Laboratories, Incorporated, Berkeley Heights, N.J., a corporation of New York Filed Sept. 21, 1966, Ser. No. 581,029

U.S. Cl. 317—234 4 Claims

Int. Cl. H01l 3/00, 5/00

ABSTRACT OF THE DISCLOSURE

P-N junctions exhibiting tunneling characteristics are prepared by liquid regrowth of n-type gallium arsenide from a gallium arsenide saturated tin solution in restricted areas on p-type gallium arsenide substrates.

This invention relates to a technique for the fabrication of a p-n junction device in which heavily doped n-type material is deposited upon a p-type substrate. More particularly, the present invention relates to a technique for the fabrication of gallium arsenide negative resistance devices based on the tunneling principle.

In recent years, there has been a birth of interest in a class of negative resistance devices termed "tunnel diodes" which evidence the characteristic tunneling behavior when operated under forward bias. Such behavior is most easily obtained by the use of degenerate or near degenerate semiconductor materials evidencing carrier concentrations of the order of $10^{19}$ cm.$^{-3}$, gallium arsenide being a prime example of such materials. Tunnel diodes utilizing this material are typically prepared by alloying tin or an alloy thereof into a zinc-doped gallium arsenide substrate. Unfortunately, such diodes prepared in accordance with conventional prior art procedures suffer from a degradation of their electrical characteristics during operation under forward bias.

In accordance with the present invention, p-n junctions exhibiting tunneling characteristics are prepared by liquid regrowth of n-type gallium arsenide from a gallium arsenide saturated tin solution in restricted areas on p-type gallium arsenide substrates. Accelerated bias-temperature stressing of diodes prepared by this technique indicates a marked superiority in aging characteristics as compared with diodes fabricated in accordance with conventional techniques.

The invention will be more easily understood by reference to the following detailed description taken in conjunction with the accompanying drawing, wherein.

Figure 4:
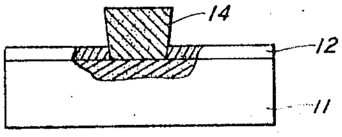
FIG. 4 is a cross-sectional view of the body of FIG. 3 after the growth of a region of n-type gallium arsenide in the window thereof.
Figure 5:
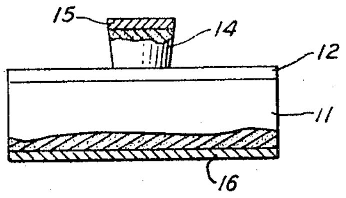
Figure 6:
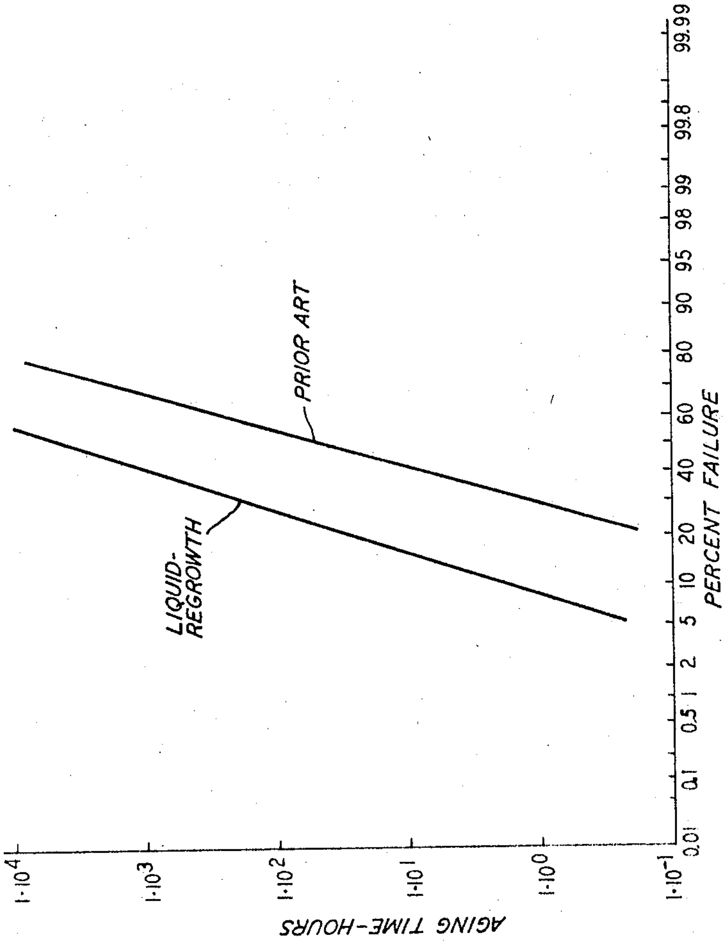

FIG. 5 is a cross-sectional view of the body of FIG. 4 after the formation of ohmic contacts thereon; and FIG. 6 is a graphical representation on coordinates of percent failure against aging time for gallium arsenide tunnel diodes prepared in accordance with the present invention and those prepared in accordance with conventional prior art techniques showing the aging characteristics under bias temperature stressing.

Figure 1:
FIG. 1 is a cross-sectional view of a wafer of p-type gallium arsenide having a carrier concentration of the order of $10^{19}$ cm.$^{-3}$.
Figure 2:
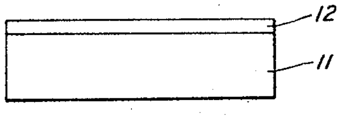
FIG. 2 is a cross-sectional view of the body of FIG. 1 after the deposition thereon of a film of silicon dioxide.

With further reference now to FIG. 1 there is shown in cross-sectional view a wafer of p-type gallium arsenide 11, obtained from commercial sources, evidencing a carrier concentration of the order of $10^{19}$ cm.$^{-3}$. Initially, wafer 11 is cleaned by conventional techniques. Thereafter, a film of silicon dioxide 12 (FIG. 2) is deposited upon the surface of the gallium arsenide substrate by any well known procedure, thermal decomposition of ethylorthosilicate being particularly suited for this purpose. The thickness of the silicon dioxide film is not critical, however, practical considerations indicate minima and maxima of 1500 and 7000 A. respectively.

Figure 3:
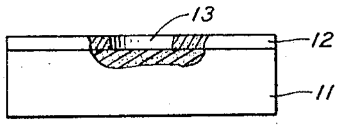
FIG. 3 is a cross-sectional view of the body of FIG. 2 after the formation of a window in the silicon dioxide layer.

Next, a window 13 (FIG. 3) is formed in the silicon dioxide film by conventional photoengraving techniques, so defining the area in which the tunnel junction is to be formed. The diameter of the window is not critical and may be as small as 12 microns. The substrate so prepared is then stored until the junction is to be grown.

A molten solution of tin saturated with gallium arsenide is prepared from n-type gallium arsenide slices, obtained from commercial sources, evidencing a carrier concentration of $10^{16}$ cm.$^{-3}$ or less. The slices are cleansed by conventional solvent degreasing and etching procedures and then crushed in a mortar and pestle. Following, tin of 99.95 percent purity, obtained from commercial sources is weighed out in a precleaned graphite boat. The crushed gallium arsenide is then weighed out in an amount sufficient to result in a gallium arsenide saturated tin solution. For the purposes of the present invention it has been found that melt compositions meeting this requirement range from 6–10 mol percent gallium arsenide, remainder tin. As noted, the melt composition is saturated with gallium arsenide, so dictating the lower limit. Although the upper limit of 10 mol percent is not absolute, practical considerations preclude the use of higher percentages. However, it will be understood that gallium arsenide percentages in excess of the saturation point are employed for the purpose of replenishing gallium arsenide consumed during the process.

The procedure employed in the growth of the junction is described in detail in copending application Ser. No. 556,192, filed June 8, 1966. Briefly, the technique described therein involves a liquid regrowth process from a molten solution of tin saturated with gallium arsenide. The process involves introducing the gallium arsenide charge into a suitable receptacle, typically a graphite boat, heating to a temperature of 700° C. in a dry hydrogen ambient for the purpose of equilibrating the charge. Then, the substrate member is introduced into the vessel. Then, the vessel is again heated in the hydrogen ambient to a temperature within the range of 500° C.–600° C., charge and substrate being separated. Following, the apparatus is tilted so that the now molten gallium arsenide saturated tin solution covers the exposed surface of the substrate, namely, the area defined by the window in the silicon dioxide surface on the p-type gallium arsenide. A controlled cooling program is then initiated until a temperature within the range of 515–615° C. (depending upon melt composition) is attained. During the cooling cycle, precipitation of gallium arsenide from the solution is initiated, so resulting in the growth of an n-type gallium arsenide region 14 in the window, such film evidencing a carrier concentration of the order of $10^{19}$ cm.$^{-3}$. Examination of the substrate reveals that etch-back is less than 0.3 micron during the processing stage. Next, hydrogen flow is halted and nitrogen flow begun, the apparatus tilted and the solution decanted from the substrate. After cooling the substrate member to room temperature, the solidified remainder of the charge is removed by heating the substrate while submerged beneath mercury covered with dilute hydrochloric acid solution. The resultant structure is completed by attaching ohmic contacts 15 and 16 to region 14 and wafer 11 respectively.

An example of the application of the present invention is set forth below. It is intended merely as an illustration and it is to be appreciated that the methods described may be varied by one skilled in the art without departing from the spirit and scope of the invention.

EXAMPLE

A wafer of zinc-doped p-type gallium arsenide, obtained from commercial sources, evidencing a carrier concentration of approximately $3\times10^{19}$ cm.$^{-3}$ was polished by conventional techniques. Thereafter, the wafer was cleaned in the following manner: (a) a methyl ethyl ketone rinse; (b) a light cotton swabbing of the polished surface while submerged in methyl ethyl ketone; (c) a methyl ethyl ketone rinse followed by a methyl ethyl ketone ultrasonic agitation; (d) a methyl alcohol rinse; (e) a distilled water rinse; (f) a 30-second soak in concentrated hydrochloric acid; (g) a distilled water rinse; (h) a methyl alcohol rinse; (i) a chloroform rinse; and (j) a chloroform ultrasonic agitation.

The wafer was then dried and set in place on a warm platinum liner that is part of the conventional apparatus employed for the thermal decomposition of ethylorthosilicate. The platinum liner was then inserted into the furnace and the system flushed for 7 minutes with a control flow of 0.75 liter per minute of forming gas at an exit pressure of 10 inches of mercury, the furnace temperature being maintained at 650° C. Next, ethylorthosilicate is introduced into the system at a rate of 0.75 liter per minute at an exit pressure of 10 inches of mercury. The ethylorthosilicate was permitted to flow through the system for 12 minutes, so resulting in the deposition of a silicon dioxide coating 5000 A. in thickness. Following deposition the system is flushed with forming gas for two minutes and then opened.

A window 25 microns in diameter was then formed in the silicon dioxide layer by conventional photolithographic techniques employing a hydrogen fluoride-ammonium fluoride etching solution comprising 28 milliliters of hydrofluoric acid, 113 grams of ammonium fluoride and 170 milliliters of water. Ultrasonic agitation of the etchant was employed to insure complete removal of the oxide from the window. The structure so prepared was then stored until the regrowth procedure was initiated.

Gallium arsenide obtained from commercial sources, evidencing a carrier concentration of $1\times10^{16}$ cm.$^{-3}$ was boiled in acetone for 10 minutes and then heated for 10 minutes in trichloroethylene. Next, the gallium arsenide was again boiled in acetone for 10 minutes and rinsed three times in deionized water. Following the gallium arsenide was etched with aqua regia until the surfaces were shiny in nature. Next, the cleansed gallium arsenide was crushed under nitrogen in a mortar and pestle. Then 0.7 gram of the crushed gallium arsenide and 5.0 grams of tin, obtained from commercial sources, evidencing a purity of 99.95 percent were inserted into a graphite boat which had been previously cleaned with aqua regia and by boiling in deionized water after which it was baked for three hours at 900° C. to remove impurities. The charge was then equilibrated in a dry hydrogen ambient by heating at 700° C. for a time period of one hour, the charge being stirred during heating so that the maximum gallium arsenide surface is exposed and to assure saturation of the resultant solution. The charge was then permitted to cool.

The structure (hereinafter referred to as substrate) prepared previously was then placed in the boat containing the charge and heated to a temperature of approximately 600° C. with the charge and substrate separated. At 600° C. the apparatus was tilted so that the molten charge ran onto the substrate and through the window thereof. The charge and substrate were then cooled to 575° C. at a rate of 12° C. per minute. Then, the reaction vessel was flushed with nitrogen and the boat removed. After cooling, the resultant structure was heated to 85° C. for 30 minutes while submerged beneath mercury covered with dilute hydrochloric acid for the purpose of removing excess tin-gallium arsenide. Small globules of mercury clinging to the substrate were then brushed off. The resultant structure including a region of n-type gallium arenside evidencing a carrier concentration within the range of 8 to $9\times10^{19}$ cm.$^{-3}$ (as determined by infrared reflection) in the silicon dioxide window was then completed by metallizing the n and p regions, the former by evaporating a 5000 A. thick film of titanium-doped gold thereon, the latter by evaporating a 5000 A. thick film of zinc-doped gold thereon. An operative tunnel diode was then obtained by binding the p side of the structure to a header and forming an alloy by means of a conventional thermocompression device. Upon the application of forward bias the peak-to-valley current ratio was found to be 9 to 1 with a peak current of approximately 5.6 milliamperes, the peak and valley voltages being 0.14 and 0.50 volt respectively. The voltage swing of the device was from 0.14 to 0.96 volt.

In order to demonstrate the superiority of tunnel diodes fabricated in accordance with the invention over those of the prior art, the following procedure was employed.

The aging characteristics of ten representative diodes, prepared by this process, have been compared under bias-temperature stressing, to those of conventional alloyed devices of about the same speed index (ma./pf.$<1$). For these tests a 3 percent change in peak current was considered to be a device failure. The alloyed devices were stressed at 0.9 v. and 100° C. The liquid-regrown devices were stress-aged for 1000 hours at 0.8 v. and 160° C. The 50 percent failure point, estimated by extrapolation, would occur at $\sim$5000 hours for the liquid-regrown diodes. The alloyed devices reached this point in 50 hours (see FIG. 6).

While the invention has been described in detail in the foregoing specification and the drawing similarly illustrates the same, it will be understood that variations may be made by one skilled in the art without departing from the spirit and scope of the invention. Thus, it will be understood that the inventive technique may be utilized for the preparation of continuous n-type films upon p-type substrates or may be combined with conventional etching techniques to form mesa structures.

What is claimed is:

1. A negative resistance device including a region of p-type gallium arsenide having a carrier concentration of the order of $10^{19}$ cm.$^{-3}$, a discontinuous layer of silicon oxide having at least one discontinuity therein in intimate contact and coextensive with a major surface of said p-type region, a region of n-type gallium arsenide having a carrier concentration of the order of $10^{20}$ cm.$^{-3}$ in intimate contact with said p-type region in the volume defined by the said discontinuity and a pair of ohmic contacts in contact with said p-type and n-type regions respectively.

2. A method for the fabrication of a negative resistance device comprising the steps of (a) depositing a layer of silicon dioxide upon a region of p-type gallium arsenide having a carrier concentration of the order of $10^{19}$ cm.$^{-3}$, (b) forming at least one window in said silicon dioxide layer by photoengraving techniques, thereby exposing a portion of the surface of said p-type gallium arsenide, (c) preparing a gallium arsenide saturated tin solution, (d) flowing said solution over said silicon dioxide layer at a temperature within the range of 575° C. to 675° C., (e) cooling said solution whereby there is formed a region of n-type gallium arsenide in the volume defined by said window, said region having a carrier concentration of the order of $10^{20}$ cm.$^{-3}$, and forming ohmic contacts upon said n-type and p-type regions respectively.

3. The method in accordance with claim 2 wherein said silicon dioxide layer is prepared by the thermal decomposition of ethylorthosilicate.

4. A method in accordance with claim 2 wherein said gallium arsenide saturated in solution is prepared by heating a mixture of from 6–10 mol percent gallium arsenide, remainder tin, to a temperature approximately of 700° C. in a dry hydrogen ambient.

References Cited

UNITED STATES PATENTS

| | | | |
|---|---|---|---|
| 2,972,092 | 2/1961 | Nelson | 317—235 |
| 3,041,508 | 6/1962 | Henkel et al. | 317—234 |
| 3,065,391 | 11/1962 | Hall | 317—234 |
| 3,110,849 | 11/1963 | Soltys | 317—237 |

JOHN W. HUCKERT, *Primary Examiner.*

R. SANDLER, *Assistant Examiner.*

U.S. Cl. X.R.

29—578